US007924606B2

(12) United States Patent
Lee

(10) Patent No.: US 7,924,606 B2
(45) Date of Patent: Apr. 12, 2011

(54) MEMORY CONTROLLER AND DECODER

(75) Inventor: Cheng-Sheng Lee, Hsinchu County (TW)

(73) Assignee: Winbond Electronics Corp., Taichung County (TW)

( * ) Notice: Subject to any disclaimer, the term of this patent is extended or adjusted under 35 U.S.C. 154(b) by 91 days.

(21) Appl. No.: 12/397,614

(22) Filed: Mar. 4, 2009

(65) Prior Publication Data

US 2010/0165708 A1 Jul. 1, 2010

(30) Foreign Application Priority Data

Dec. 25, 2008 (TW) ................................ 97150764 A

(51) Int. Cl.
*G11C 11/00* (2006.01)
*G11C 19/082* (2006.01)
(52) U.S. Cl. .................. 365/156; 365/154; 365/230.06; 326/106
(58) Field of Classification Search .................. None
See application file for complete search history.

(56) References Cited

U.S. PATENT DOCUMENTS

| 7,151,712 | B1 | 12/2006 | Lee |
| 2008/0049539 | A1* | 2/2008 | Miyata ................ 365/230.06 |
| 2008/0080296 | A1* | 4/2008 | Lee et al. ............. 365/230.06 |
| 2008/0101148 | A1 | 5/2008 | Lee |

FOREIGN PATENT DOCUMENTS

TW I273606 2/2007

* cited by examiner

*Primary Examiner* — Huan Hoang
*Assistant Examiner* — James G Norman
(74) *Attorney, Agent, or Firm* — J.C. Patents

(57) ABSTRACT

A memory controller and a decoder are provided. The decoder is adapted to the memory controller. The decoder includes a first transistor to a fourth transistor. Gates of the first to the fourth transistor are coupled to a first to a fourth control signal respectively. A first terminal and a second terminal of the first transistor are coupled to a first voltage and a first terminal of the second transistor respectively. First terminals and second terminals of the third transistor and the fourth transistor are coupled to a second terminal of the second transistor and a second voltage respectively. When the first transistor and the second transistor are turned off, a voltage of the second control signal is lower than a voltage of the first control signal. Thereby, a gate-induced drain leakage (GIDL) current of the transistors is reduced.

7 Claims, 6 Drawing Sheets

MEMORY CONTROLLER AND DECODER

CROSS-REFERENCE TO RELATED APPLICATION

This application claims the priority benefit of Taiwan application serial no. 97150764, filed on Dec. 25, 2008. The entirety of the above-mentioned patent application is hereby incorporated by reference herein and made a part of specification.

BACKGROUND OF THE INVENTION

1. Field of the Invention

The present invention generally relates to a memory controller and a decoder, in particular, to a circuit that may reduce a gate-induced drain leakage (GIDL) current.

2. Description of Related Art

A memory is a storage device having advantages such as a fast access speed, and small volume. Currently, memories have already been widely applied in various electronic devices. During data read/write processes of a memory, a decoder is required for addressing. A conventional address decoder is illustrated in the following.

FIG. 1 is a circuit diagram of a conventional address decoder. An address decoder 10 is formed of transistors 11-13. A control signal bMWL may be used to control the ON/OFF of the transistors 11, 12. A control signal WLRST may be used to control the ON/OFF of the transistor 13. Thereby, a signal WL is controlled.

It should be noted that a gate-induced drain leakage current (GIDL) often occurs in the transistor 11. The GIDL current causes memory chip stand-by current larger.

SUMMARY OF THE INVENTION

The present invention is directed to a decoder, capable of reducing a gate-induced drain leakage current (GIDL).

The present invention is further directed to a memory control circuit, in which a GIDL current of a transistor is limited by another transistor, so as to reduce the GIDL current.

The present invention provides a decoder, which includes a first transistor to a fourth transistor. A gate and a first terminal of the first transistor are coupled to a first control signal and a first voltage respectively. A gate and a first terminal of the second transistor are coupled to a second control signal and a second terminal of the first transistor respectively. A gate, a first terminal, and a second terminal of the third transistor are coupled to a third control signal, a second terminal of the second transistor, and a second voltage respectively. A gate, a first terminal, and a second terminal of the fourth transistor are coupled to a fourth control signal, the second terminal of the second transistor, and the second voltage respectively. When the first transistor is turned off and the second transistor is turned off, a voltage of the second control signal is lower than a voltage of the first control signal.

In an embodiment of the present invention, the first transistor, the second transistor, the third transistor, and the fourth transistor are a P-channel metal oxide semiconductor field effect transistor, a P-channel metal oxide semiconductor field effect transistor, an N-channel metal oxide semiconductor field effect transistor, and an N-channel metal oxide semiconductor field effect transistor respectively.

In an embodiment of the present invention, the decoder further includes a fifth transistor. A gate, a first terminal, and a second terminal of the fifth transistor are coupled to a fifth control signal, the second terminal of the second transistor, and the second voltage respectively. In another embodiment, the fifth transistor is an N-channel metal oxide semiconductor field effect transistor. In a further embodiment, the second terminal of the second transistor may serve as an output terminal of the decoder.

From another point of view, the present invention provides a memory controller. The memory controller includes a first inverter, a second inverter, and an output unit. The output unit includes a first transistor to a third transistor. The first inverter may receive a first control signal and generate a second control signal accordingly. An input terminal of the second inverter is coupled to an output terminal of the first inverter, so that the second inverter may receive the second control signal and output a third control signal accordingly. The output unit is coupled to an output terminal of the second inverter. The gate of the first transistor receives the third control signal. The first terminal of the first transistor is coupled to the first voltage. The gate of the second transistor receives the third control signal. The first terminal of the second transistor is coupled to the second terminal of the first transistor. The gate, the first terminal, and the second terminal of the third transistor are coupled to a fourth control signal, the second terminal of the second transistor, and the second voltage respectively. When the second transistor is turned off and the third transistor is turned off, a voltage of the fourth control signal is lower than a voltage of the third control signal.

In an embodiment of the present invention, the first transistor, the second transistor, and the third transistor are a P-channel metal oxide semiconductor field effect transistor, an N-channel metal oxide semiconductor field effect transistor, and an N-channel metal oxide semiconductor field effect transistor respectively.

In an embodiment of the present invention, the memory controller further includes a third inverter. An input terminal of the third inverter is coupled to the output terminal of the first inverter, so that the third inverter may receive the second control signal and output a fifth control signal accordingly.

As discussed above, in the present invention, series-connected first, second transistors are arranged in the decoder or the memory controller. When the first transistor is turned off and the second transistor is turned off, a voltage received at the gate of the second transistor is different from a voltage received at the gate of the first transistor. The first transistor may limit a turn-on current of the series-connected path, and the second transistor may limit the magnitude of the GIDL, so as to reduce a leakage current of the series-connected path.

To clarify the foregoing features and advantages of the present invention, the following embodiments are illustrated in detail in connection with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
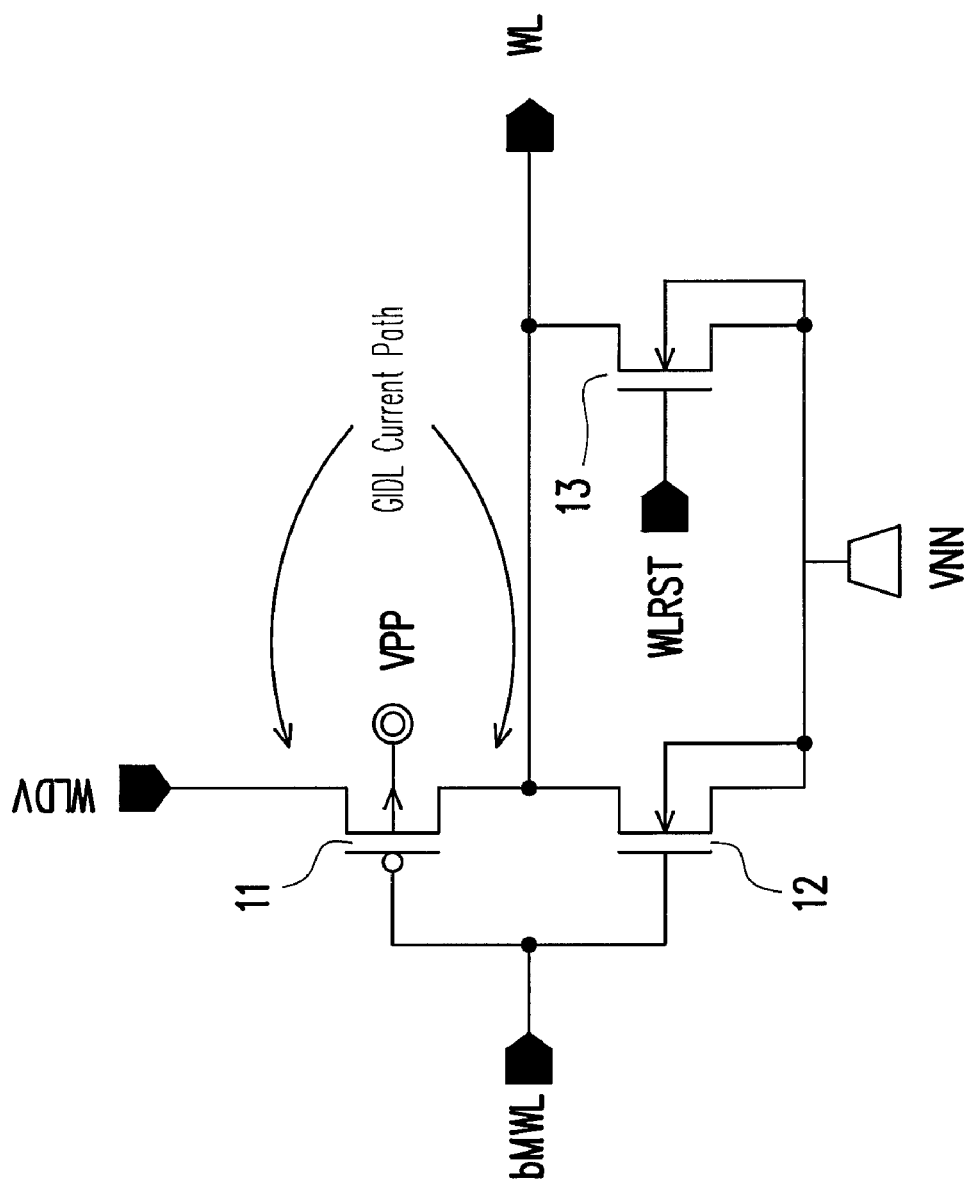
FIG. 1 is a circuit diagram of a conventional address decoder.

Reference will now be made in detail to the present embodiments of the invention, examples of which are illustrated in the accompanying drawings. Wherever possible, the same reference numbers are used in the drawings and the description to refer to the same or like parts.

Figure 2:
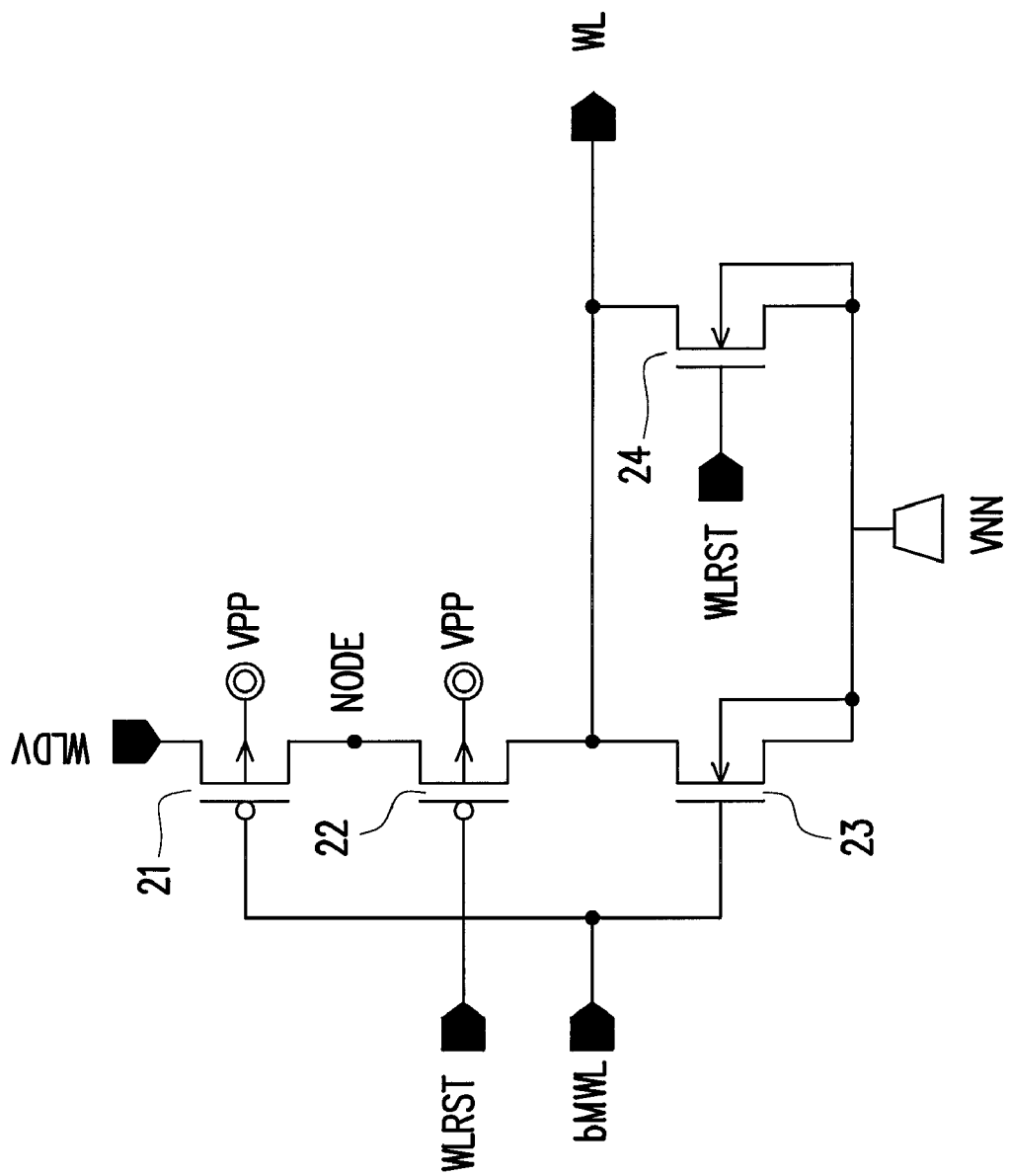
FIG. 2 is a circuit diagram of a decoder according to an embodiment of the present invention.

FIG. 2 is a circuit diagram of a decoder according to an embodiment of the present invention. A decoder 20 is an address decoder. In particular, the decoder 20 may be a column decoder or a row decoder. The decoder 20 includes transistors 21-24. In this embodiment, the transistors 21-24 respectively being a P-channel metal oxide semiconductor field effect transistor, a P-channel metal oxide semiconductor field effect transistor, an N-channel metal oxide semiconductor field effect transistor, and an N-channel metal oxide semiconductor field effect transistor, are taken as examples for illustration. However, the present invention is not limited thereto.

A gate of the transistor 21 receives a control signal bMWL, a potential of which is a relatively high VPP when being not selected, and decides the ON/OFF of the transistor 21 accordingly. A gate of the transistor 22 receives a control signal WLRST, a potential of which is VINT when being not selected, and decides the ON/OFF of the transistor 22 accordingly. A gate of the transistor 23 receives a control signal bMWL, and decides the ON/OFF of the transistor 23 accordingly. A gate of the transistor 24 receives a control signal WLRST, and decides the ON/OFF of the transistor 24 accordingly. Although the gates of the transistors 21, 23 receive the same voltage in this embodiment, in other embodiments the gates of the transistors 21, 23 may also receive different voltages. In addition, although the gates of the transistor 22, 24 receive the same voltage, in other embodiments the gates of the transistors 22, 24 may also receive different voltages.

A source and a drain of the transistor 21 are coupled to a signal WLDV and a source of the transistor 22 respectively. A drain of the transistor 22 is coupled to drains of the transistors 23, 24, which may serve as an output terminal of the decoder 20. Sources of the transistors 23, 24 are coupled to a voltage VNN. In addition, bulk voltages of the transistors 21, 22 may be the voltage VPP. Bulk voltages of the transistors 23, 24 may be the voltage VNN.

Figure 3:
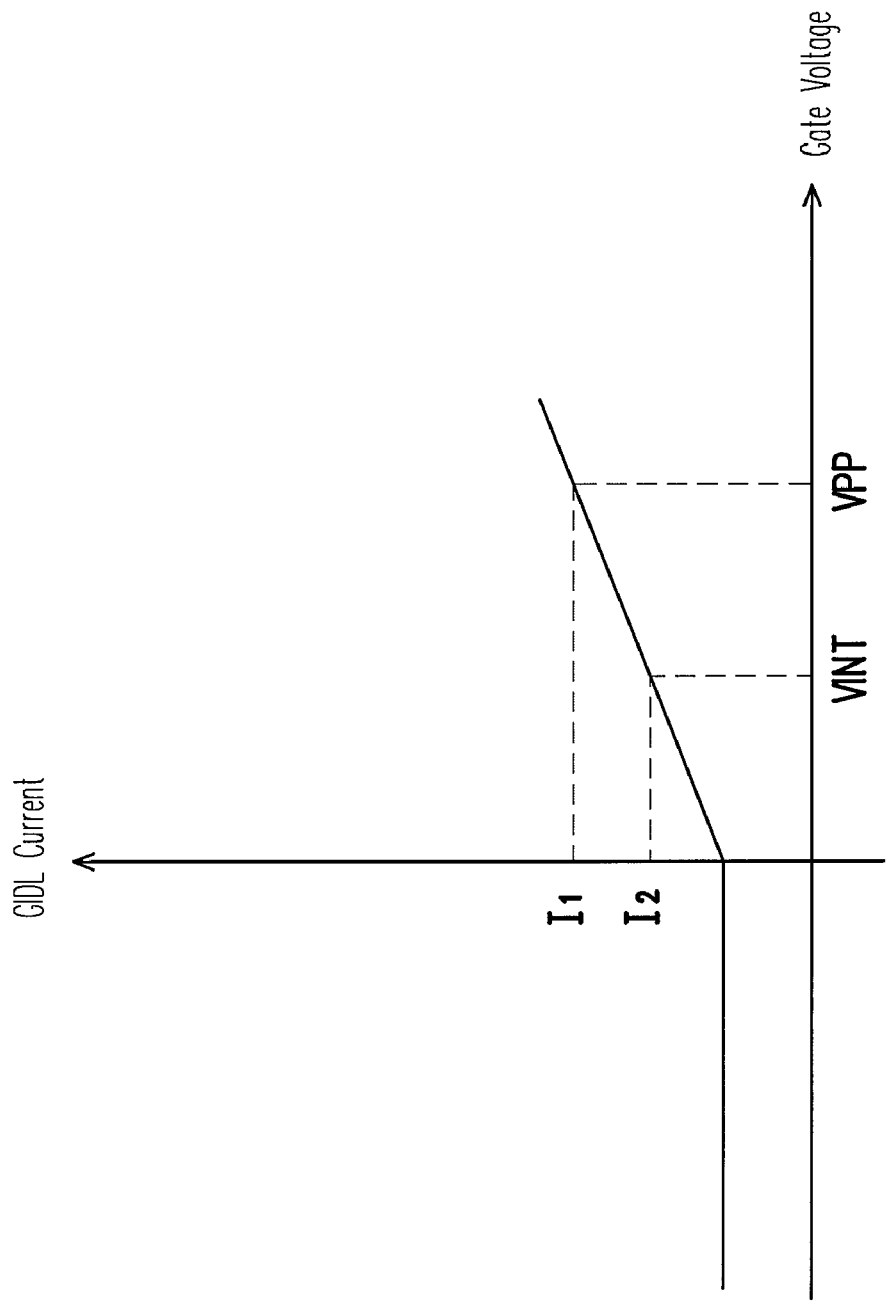
FIG. 3 is a schematic view of a GIDL current and a gate voltage of a P-channel metal oxide semiconductor field effect transistor according to the embodiment of the present invention.

FIG. 3 is a schematic view of a GIDL current and a gate voltage of a P-channel metal oxide semiconductor field effect transistor according to the embodiment of the present invention. Referring to FIGS. 2 and 3 together, when the transistor 21 is turned off and the transistor 22 is turned off, a voltage of the control signal WLRST is lower than a voltage of the control signal bMWL. For example, the voltage of the control signal bMWL is the voltage VPP, and the voltage of the control signal WLRST is the voltage VINT. In this case, a GIDL current of the transistor 21 is $I_1$, a GIDL current of the transistor 22 is $I_2$, and $I_2$ is less than $I_1$. That is to say, in this embodiment the transistor 22 is used to limit a turn-on current of the series-connected transistors 21, 22, and the transistor 22 is used to limit the GIDL current. Thus, the GIDL leakage current of the decoder 20 may be effectively reduced, preventing operation errors of the decoder 20.

Figure 4:
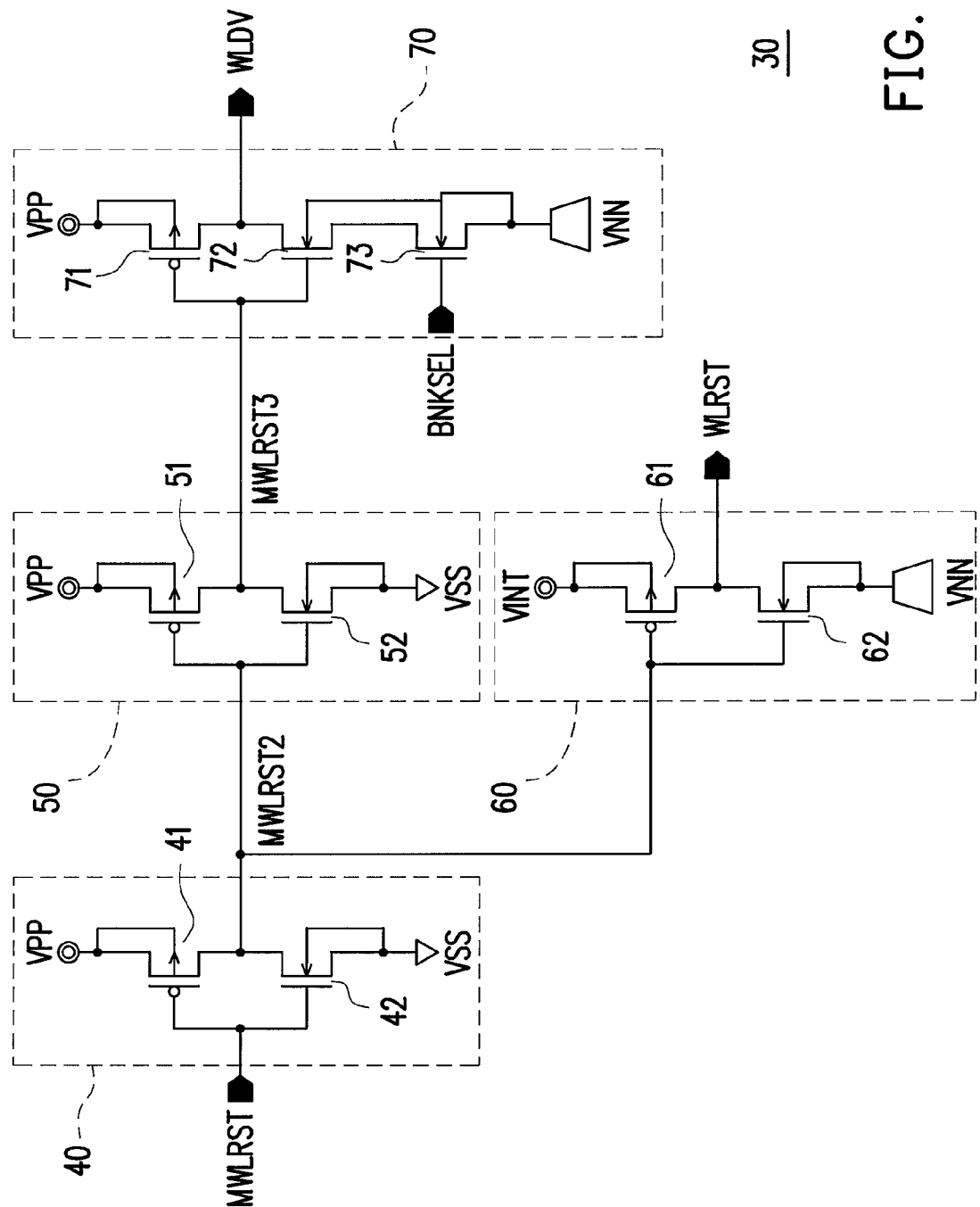
FIG. 4 is a circuit diagram of a memory controller according to the embodiment of the present invention.
Figure 5:
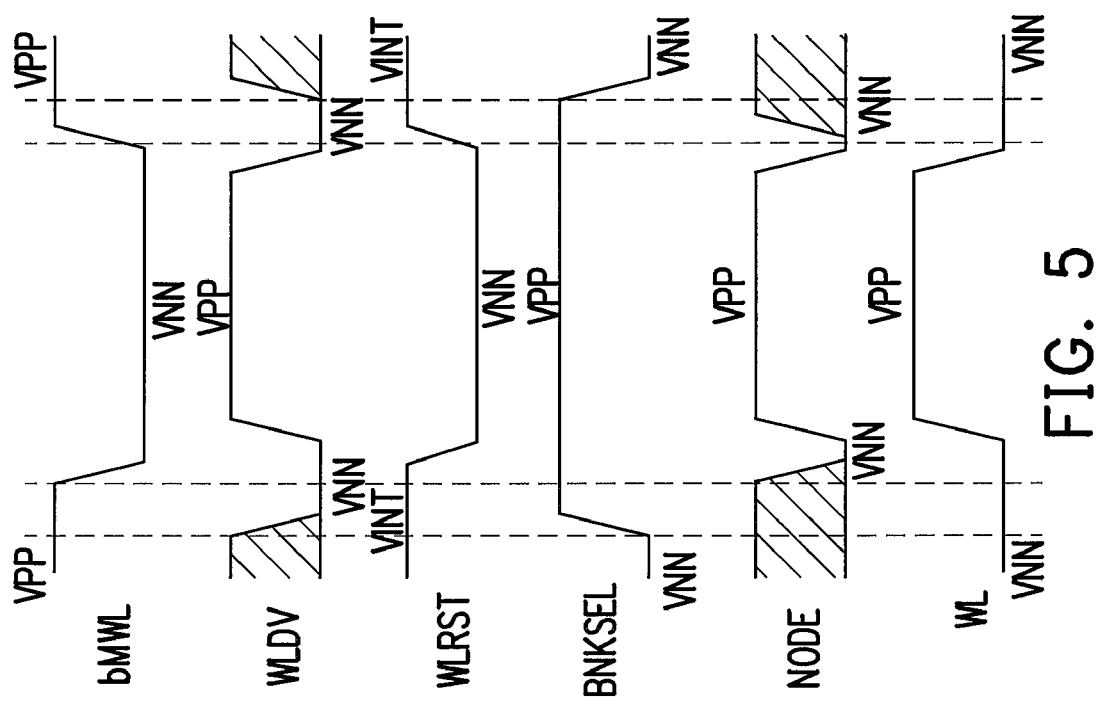
FIG. 5 is a signal waveform graph for FIG. 2 and FIG. 4.

Likewise, the above mentioned ways for reducing the GIDL current may also be applied in other circuits. For example, FIG. 4 is a circuit diagram of a memory controller according to the embodiment of the present invention. FIG. 5 is a signal waveform graph for FIG. 2 and FIG. 4. Referring to FIGS. 2, 4, and 5 together, a memory control circuit 30 is used to control the decoder 20. The memory control circuit 30 includes inverters 40, 50 and an output unit 70. In addition, the memory control circuit 30 may also include an inverter 60. The inverter 40 includes transistors 41, 42. The inverter 50 includes transistors 51, 52. The inverter 60 includes transistors 61, 62. The output unit 70 includes transistors 71-73. In this embodiment, the transistors 41, 51, 61, and 71 are illustrated by P-channel metal oxide semiconductor field effect transistors, and the transistors 42, 52, 62, 72, and 73 are illustrated by N-channel metal oxide semiconductor field effect transistors.

The inverter 40 receives a control signal MWLRST, and generates a control signal MWLRST2 accordingly. The control signal MWLRST2 and the control signal MWLRST are inverted. An input terminal of the inverter 50 is coupled to an output terminal of the inverter 40, so that the inverter 50 receives the control signal MWLRST2 and outputs a control signal MWLRST3 accordingly. The control signal MWLRST3 and the control signal MWLRST2 are inverted. An input terminal of the inverter 60 is coupled to the output terminal of the inverter 40, so that the inverter 60 receives the control signal MWLRST2, and outputs a control signal WLRST accordingly. The control signal WLRST and the control signal MWLRST2 are inverted.

As discussed above, the output unit 70 is coupled to an output terminal of the inverter 50, so that the output unit 70 receives the control signal MWLRST3 and outputs the signal WLDV accordingly. The signal WLDV and the control signal MWLRST3 are inverted. It should be noted that the transistor 72 and the transistor 73 are series-connected. When the transistor 72 is turned off and the transistor 73 is turned off, a voltage of the control signal MWLRST3 is higher than a voltage of a control signal BNKSEL. Thus, a turn-off current of the transistor 73 is less than the GIDL current of the transistor 21 in FIG. 2. From another point of view, in this embodiment, the transistor 73 may limit the GIDL current, so as to reduce the GIDL leakage current of the decoder 20 in FIG. 2.

It should be noted that although a possible configuration for the memory controller and the decoder has been described in the foregoing embodiments, those skilled in the art should appreciate that different manufactures have different designs for the memory controller and the decoder, and therefore the application of the present invention should not be limited to such a possible configuration. In other words, as long as voltages received by gates of two series-connected transistors are different from each other when the two transistors are turned off, and one transistor is used to limit the turn-on current, while another transistor is used to limit the GIDL current, the situation then falls within the spirit of the present invention. Other implementations are discussed in the following so that those skilled in the art could further appreciate the spirit of the present invention, as well as implement the present invention accordingly.

Referring to FIG. 2 again, in the above embodiments, the bulk voltages of the transistors 21, 22 are illustrated by the voltage VPP; however, the present invention is not limited to this.

Figure 6:
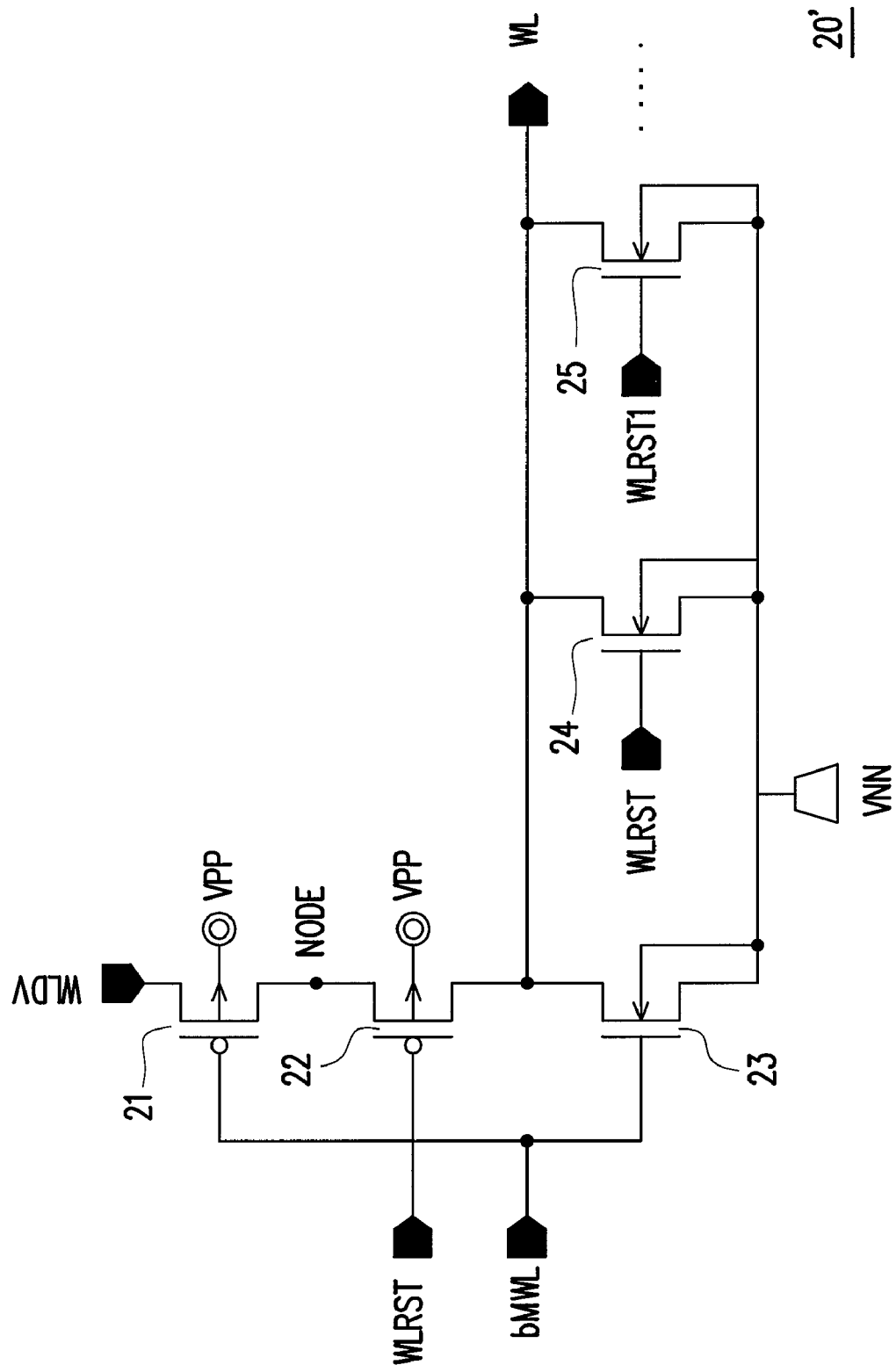
FIG. 6 is a circuit diagram of a decoder according to another embodiment of the present invention.

In addition, the decoder 20 disclosed in FIG. 2 is only an optional embodiment. In other embodiments, a decoder may also include a different number of transistors. For example, FIG. 6 is a circuit diagram of a decoder according to another embodiment of the present invention. Referring to FIGS. 2 and 6 together, a decoder 20' is similar to the decoder 20. The difference is that the decoder 20' further includes a plurality of transistors (only represented by a transistor 25). A gate of the transistor 25 receives a control signal WLRST1, and decides the ON/OFF of the transistor 25 accordingly. Thereby, the decoder 20' may have more operation states.

In view of the above, series-connected first, second transistors are arranged in the decoder or the memory controller in the present invention. When the first transistor is turned off and the second transistor is turned off, the voltage received by the gate of the second transistor is different from the voltage received by the gate of the first transistor. The first transistor may limit the turn-on current of the series-connected path, and the second transistor may limit the magnitude of the GIDL current, so as to reduce the leakage current of the series-connected path.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoder, comprising:
   a first transistor, having a gate and a first terminal coupled to a first control signal and a first voltage respectively;
   a second transistor, having a gate and a first terminal coupled to a second control signal and a second terminal of the first transistor respectively;
   a third transistor, having a gate, a first terminal, and a second terminal coupled to a third control signal, a second terminal of the second transistor, and a second voltage respectively; and
   a fourth transistor, having a gate, a first terminal, and a second terminal coupled to a fourth control signal, the second terminal of the second transistor, and the second voltage respectively, and the second control signal and the fourth control signal are the same,
   wherein when the first transistor is turned off and the second transistor is turned off, a voltage of the second control signal is lower than a voltage of the first control signal.

2. The decoder according to claim 1, wherein the first transistor, the second transistor, the third transistor, and the fourth transistor are a P-channel metal oxide semiconductor field effect transistor, a P-channel metal oxide semiconductor field effect transistor, an N-channel metal oxide semiconductor field effect transistor, and an N-channel metal oxide semiconductor field effect transistor respectively.

3. The decoder according to claim 1, further comprising:
   a fifth transistor, having a gate, a first terminal, and a second terminal coupled to a fifth control signal, the second terminal of the second transistor, and the second voltage respectively.

4. The decoder according to claim 3, wherein the fifth transistor is an N-channel metal oxide semiconductor field effect transistor.

5. The decoder according to claim 1, wherein the second terminal of the second transistor serves as an output terminal of the decoder.

6. A memory controller, comprising:
   a first inverter, for receiving a first control signal and generating a second control signal accordingly;
   a second inverter, having an input terminal coupled to an output terminal of the first inverter, for receiving the second control signal and generating a third control signal accordingly;
   a third inverter, having an input terminal coupled to the output terminal of the first inverter, for receiving the second control signal and outputting a fifth control signal accordingly; and
   an output unit, coupled to an output terminal of the second inverter, wherein the output unit comprises:
   a first transistor, having a gate receiving the third control signal, and a first terminal coupled to a first voltage;
   a second transistor, having a gate receiving the third control signal, and a first terminal coupled to a second terminal of the first transistor; and
   a third transistor, having a gate, a first terminal, and a second terminal coupled to a fourth control signal, a second terminal of the second transistor, and a second voltage respectively;
   wherein when the second transistor is turned off and the third transistor is turned off, a voltage of the fourth control signal is lower than a voltage of the third control signal.

7. The memory controller according to claim 6, wherein the first transistor, the second transistor, and the third transistor are a P-channel metal oxide semiconductor field effect transistor, an N-channel metal oxide semiconductor field effect transistor, and an N-channel metal oxide semiconductor field effect transistor respectively.

* * * * *